United States Patent [19]

Ishigaki et al.

[11] 3,803,505

[45] Apr. 9, 1974

[54] GAIN CONTROL CIRCUIT

[75] Inventors: Yoshio Ishigaki, Tokyo; Takashi Okada, Yamato; Yoshiaki Ogawara, Tokyo, all of Japan

[73] Assignee: Sony Corporation, Tokyo, Japan

[22] Filed: July 26, 1973

[21] Appl. No.: 382,660

[30] Foreign Application Priority Data

July 27, 1972 Japan .............................. 47-75415

[52] U.S. Cl. ................................ 330/29, 330/30 D

[51] Int. Cl. ............................................ H03g 3/30

[58] Field of Search ............ 330/29, 30 D, 69, 145; 325/319

[56] References Cited

UNITED STATES PATENTS 3,706,937 12/1972 Hanna .............................. 330/29 X

*Primary Examiner*—Herman Karl Saalbach
*Assistant Examiner*—James B. Mullins
*Attorney, Agent, or Firm*—Lewis H. Eslinger; Alvin Sinderbrand

[57] ABSTRACT

A circuit in which signal gain is controlled independently of the quiescent direct current level. The quiescent current flows through a transistor connected as part of a constant current circuit and is modulated by signals applied to the base. The constant current circuit is connected in series with a pair of differentially connected transistors, both of which are connected in series with the load. The percentage of the total direct current through the differentially connected transistors is controlled by a direct signal applied to one of them. A current through that transistor also flows to the constant current circuit through a diode, the impedance of which is controlled by the magnitude of the direct current through it. The diode, the constant current circuit and a capacitor are connected in a second loop, and part of the signal circuit flows through this loop in a magnitude determined by the impedance of the direct current biased diode. The remainder of the signal current and all of the quiescent direct current flow through the load. Thus, the amplitude of signal voltage across the load is controlled by the percentage of direct current that biases the diode. The capacitor may be eliminated by duplicating the remainder of the circuit and connecting the duplicate parts as a differential and amplifier system.

7 Claims, 4 Drawing Figures

GAIN CONTROL CIRCUIT

BACKGROUND OF THE INVENTION

1. Field Of The Invention

This invention relates to a semiconductor gain control circuit and particularly to a circuit that is suitable for construction as an integrated circuit.

2. Description Of The Invention

The advantages of integrated circuits in size and cost reduction are well known. Also well known is the fact that such circuits preferably employ direct coupling because it is difficult to make coupling capacitors in an integrated circuit.

One disadvantage of direct coupling is that the direct current component of the signal is varied along with the alternating current component in any gain control circuit.

It is also a well-known attribute of integrated circuits that they are especially adapted to be constructed as balanced circuits. It is much easier to construct two similar components such as two resistors or two transistors on a single integrated circuit (I.C.) support, or chip, so that they are virtually identical with each other than it is to produce them to be identical from one integrated chip to the next. In a balanced circuit it may make little difference whether a particular resistor has a value of 20,000 ohms or 30,000 ohms, provided it can be used in a balanced circuit configuration with another resistor made in exactly the same way so as to have exactly the same resistance. On the other hand, in an unbalanced circuit, it may make considerable difference whether a resistor has a resistance of 20,000 ohms or 30,000 ohms. Thus, the gain control circuit constructed in integrated circuit form should also be capable of being incorporated into a balanced circuit configuration. The control device, itself, should preferably be only a single potentiometer and not a pair of ganged potentiometers.

It is an object of the present invention to provide an improved gain control circuit capable of being made in integrated circuit form and of controlling the signal gain independently of quiescent direct current.

Another object is to provide a gain control circuit having a balanced circuit configuration for incorporation in an integrated circuit.

A further object of the present invention is to provide a gain control circuit in which the control function is carried out by direct current to permit the potentiometer that governs the controlling current to be located at some distance from the signal circuit but without the disadvantage of having the signal current traverse a long path in which it would be subjected to the possibility of picking up interfering signals.

Further objects will become apparent from reading the following specification together with the drawings.

SUMMARY OF THE INVENTION

In accordance with the present invention, a signal amplifying transistor is connected to a signal source. The output circuit of the transistor is connected as part of a constant current circuit, and, as a result, the direct current flowing through the constant current circuit is held at a fixed value. Superimposed on this direct, or quiescent, current is a signal current controlled by the signal voltage applied to the input of the transistor. The output circuit of the transistor acts as a current source for signal current, also. This constant current circuit is connected to the emitter circuits of two differentially connected transistors, one of which is the transistor that controls the gain of the circuit. This gain control transistor has a controllable impedance element, such as a diode, connected in series with it between its emitter and the constant current circuit. The collectors of both of the differentially connected transistors are connected in series with a load impedance so that all of the direct current of the circuit passes through the load. The constant current circuit and the diode are connected in series with a circuit that is conductive to the alternating signal currents but not to the quiescent direct current.

The percentage of the total direct quiescent current that can flow through the gain control transistor and the diode is determined by a controllable direct voltage applied to the gain control transistor.

The remainder of the quiescent current flows through the other transistor of the differentially connected pair of transistors. For convenience, this other transistor may be referred to as the signal transistor. It is biased by a fixed voltage source and, in accordance with normal differential amplifier operation, variation of the direct current through the gain control transistor causes an opposite change in the direct current through the signal transistor. Since the total direct current for both of these transistors flows through the load, there is no change in the quiescent voltage across the load due to any change in the percentage of the quiescent current carried by the signal transistor.

Means are provided to prevent signal current from flowing through the gain control transistor. Such means can include a capacitor connected in series between a fixed potential and a point in the circuit of the control transistor. The capacitor must have an impedance that is quite low for all of the signal frequencies so as to prevent the emitter voltage of the transistor from varying in response to modulation of the quiescent current by the signal component.

The amplitude of the signal current through the load impedance is less than the amplitude of the total signal current through the constant current circuit. The signal current variations are initially imposed upon the quiescent current, which creates a relationship between the amplitude of the signal current and the magnitude of the direct, quiescent current. When the quiescent current in the signal transistor is reduced by a change in the control signal applied to the gain control transistor, the amplitude of the signal components through the signal transistor automatically are changed at the same time. Thus, although there is a fixed relationship between the signal current and the quiescent current through the signal transistor, there is a controllable relationship between the signal current component and the total fixed, direct current through the load impedance. As a result, the output voltage across the load impedance due to the quiescent direct current remains constant, but the amplitude of the voltage due to the changing signal current varies in response to the control signal applied to the gain control transistor.

The fraction of the available signal current component that can flow through the loop comprising the constant current circuit, the diode, and the capacitor is determined by the impedance of the diode, which, in turn, is controlled by the fraction of the quiescent current permitted to flow through it by the gain control transistor. When the diode impedance is low, a high percentage of the signal current component flows through it. As a result, the remainder of the signal current, which flows through the load impedance, is correspondingly low. Conversely, when the impedance of the diode is high, the amplitude of the signal current flowing through the load impedance increases. Thus, the impedance of the diode, which is controlled by the gain control transistor, in turn controls the amplitude of the output signal voltage while the quiescent voltage remains fixed.

DETAILED DESCRIPTION OF THE INVENTION

Figure 1:
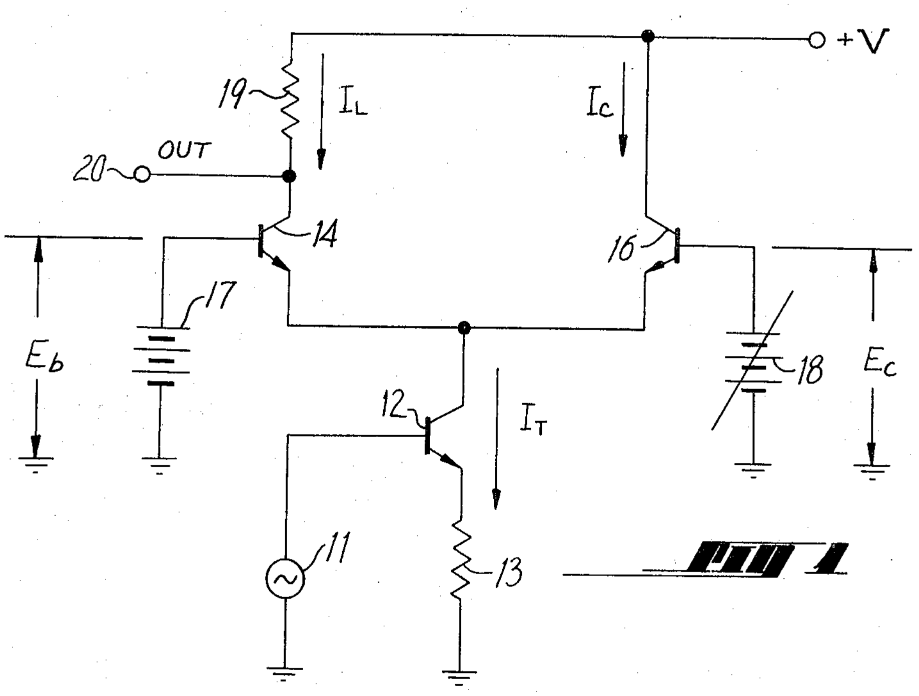
FIG. 1 is a schematic circuit diagram of a differential amplifier incorporating gain control according to the prior art.

The circuit in FIG. 1 includes a signal voltage source 11 connected to the base of a transistor 12. In accordance with established differential amplifier technology, a relatively high impedance resistor 13 is connected between the emitter of the transistor 12 and ground so that the combination of the emitter-collector circuit of the transistor and the resistor 13 is, in effect, a constant current circuit.

The collector of the transistor 12 is connected to the emitter of two differentially connected transistors 14 and 16. These are, respectively, the signal transistor and the control transistor. The base of the signal transistor 14 is connected to a bias voltage source 17 having a fixed bias voltage $E_b$, and the base of the control transistor 16 is connected to a control voltage source 18 having a variable voltage $E_c$. The collector of the control transistor 16 is connected directly to one terminal of the power supply while the collector of the signal transistor 14 is connected through a load resistor 19 to the power supply. The signal output terminal 20 of the circuit is connected to the collector of the signal transistor 14.

The load current $I_L$ flows through the load impedance 19 and the transistor 14. A current $I_C$ flows through the transistor 16.

The currents $I_L$ and $I_c$ add together at the emitters of the transistors 14 and 16 to form the total current $I_T$ that flows through the constant current source comprising the transistor 12 and the resistor 13. The ratio of the current $I_L$ to the current $I_T$ is given by the equation $$\frac{I_L}{I_T}=\frac{1}{1+\exp\frac{q}{KT}(E_C-E_B)} \quad (1)$$

where:

$q$ is the unit charge $K$ is Boltzman's constant $T$ is the absolute temperature in degrees Kelvin.

Figure 2:
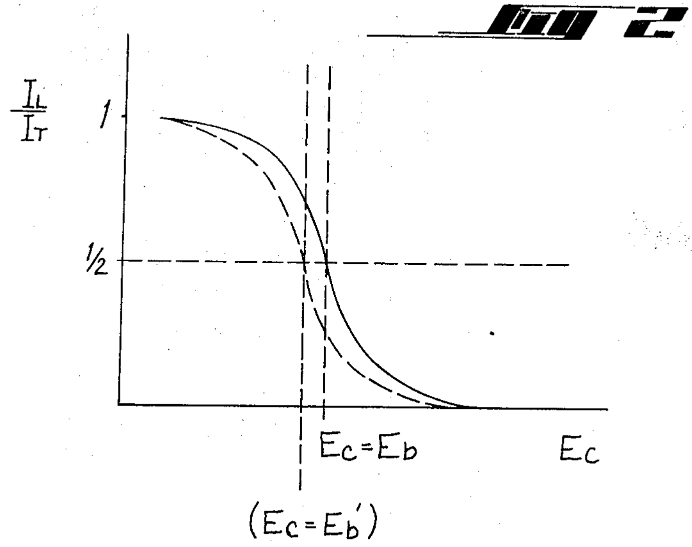
FIG. 2 is a graph of the operating characteristics of the circuit in FIG. 1.

FIG. 2 is a graph of equation (1) with the abscissa in the ratio of $E_B$ to $E_C$ and the ordinate in the ratio of $I_L$ to $I_T$. The fraction $I_L/I_T$ represents the gain of the circuit, and, as may be seen, is a non-linear function of the ratio of the voltages $E_B/E_C$. This is not satisfactory for linear circuits. Another important disadvantage of this circuit is that the quiescent level of the collector of the signal transistor 14 changes in response to changes of the direct current through the control transistor 16 as determined by the reference voltage $E_C$ of the source 18.

The total current $I_T$ that can flow through the transistors 14 and 16 is determined by the constant current circuit comprising the transistor 12 and the resistor 13, If the control voltage of the source 18 is changed to increase the amount of current $I_C$ flowing through the control transistor 16, it causes a corresponding decrease in the direct current $I_L$ flowing through the transistor 14. Conversely, if the voltage of the reference source 18 is reduced, the current $I_C$ through the control transistor 16 will also be reduced and the current $I_L$ through the signal transistor 14 will automatically be increased.

The quiescent current through the transistor 12 is modified, or modulated, by the signal current resulting from the signal voltage applied to the base from the source 11. When the current $I_T$ is divided into the two parts $I_L$ and $I_C$, both of these parts include a direct current component and a signal current component in the same ratio as the direct current component and signal current component in the total cirrent $I_T$. The ratio of the current $I_L$ to the current $I_C$ is inversely proportional to the ratio of the impedances through which those currents must flow, but both of the currents $I_L$ and $I_C$ flow through circuits that are not frequency sensitive. Thus, when the current $I_L$ flowing through the load impedance 19 is reduced by increasing the voltage $E_c$ of the source 18, both the signal component and the direct component of the current $I_L$ increase correspondingly, which is undesirable.

In the circuit in FIG. 1 a slight change of the supposedly fixed voltage $E_b$ greatly affects the gain of the circuit. This phenomenon is shown in dotted lines in FIG. 2. If the fixed voltage $E_b$ changes to $E_b'$, the curve shown as a solid line will shift to the position shown in a dotted line. As a result, the gain of the circuit will have a much lower value than is expected from the value of the reference signal $E_c$. A circuit so sensitive to changes is not suitable for mass production.

Figure 3:
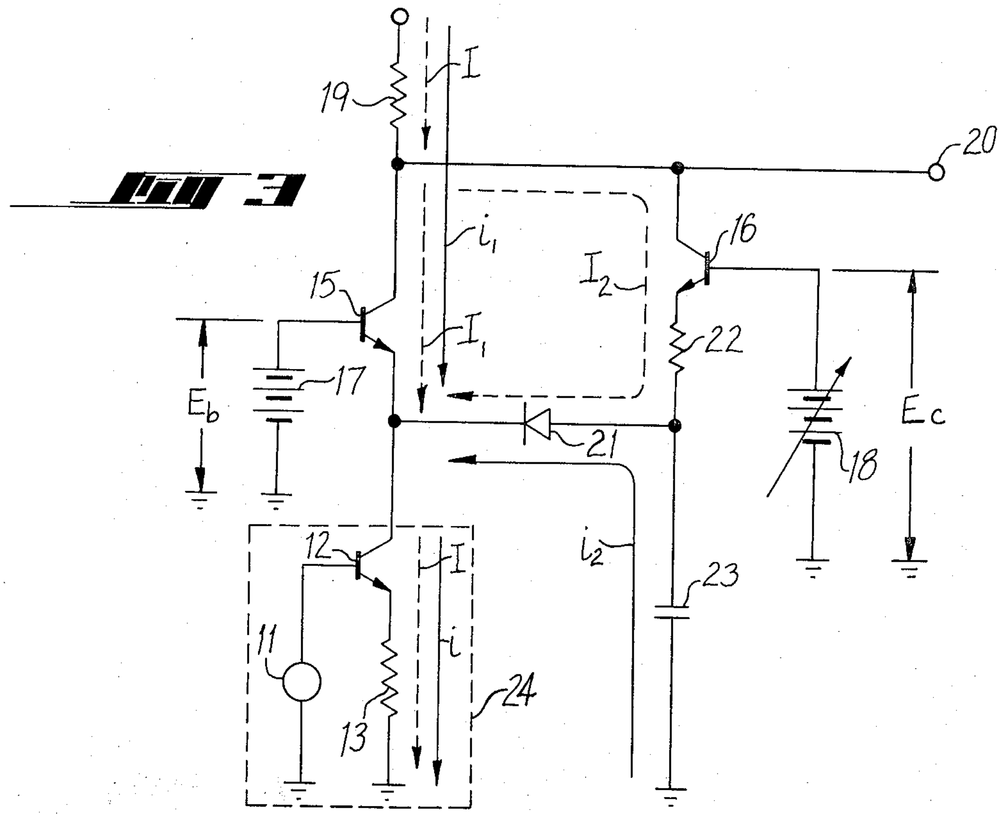
FIG. 3 is a schematic circuit diagram of one embodiment of a gain control circuit according to the present invention.

FIG. 3 shows a circuit arranged according to the present invention to separate the paths for the direct current and the signal current. This circuit permits the amplitude of the signal current to be changed without affecting the direct current. Many of the components in the circuit in FIG. 3 are the same as in the circuit in FIG. 1 and have been given similar reference numerals.

The new components in the circuit in FIG. 3 include a diode 21 and a resistor 22 connected in series between the collector of the transistor 12 and the emitter of the transistor 16. The other component not found in the circuit in FIG. 1 is a capacitor 23 connected between ground and the common junction of the diode 21 and the resistor 22.

The direct current in the circuit in FIG. 3 follows the path indicated by dotted arrows while the signal current follows the path indicated by solid arrows. The circuit permits the direct current components and the signal current components to be considered separately, but, as in the circuit in FIG. 1, all of the current flows through the transistor 12 and the resistor 13 which, together with the source 11, are identified as a constant current circuit 24. The total direct current is identified by the letter I and the total signal current is identified by the letter $i$ in this circuit. The collector of the control transistor 16 is directly connected to the collector of the signal transistor 14 so that the direct current to both of the transistors 14 and 16 flows through the load impedance 19. At the collectors of the transistors 14 and 16, the direct current I divides into two components, $I_1$ and $I_2$. As in the circuit in FIG. 1, the ratios of these two currents is inversely proportional to the ratios of the impedances of the circuits through which they must flow. The magnitude of the voltage $E_c$ of the control source 18 determines the relative values of the direct current components $I_1$ and $I_2$ just as in the circuit in FIG. 1. However, no matter what the ratio of the current $I_1$ to the current $I_2$, their total value is constant and is determined by the constant current circuit 24. Thus, the quiescent current I flowing through the load impedance 19 always creates the same quiescent voltage drop across the load and the direct voltage level of the output terminal 20 is always the same.

The circuit 24 also controls the magnitude of the signal current $i$ in response to the voltage from the source 11. As is shown by the solid arrows, this total signal current $i$ is drawn in part through the load impedance 19 and the signal transistor 14 as indicated by the value $i_1$. The remainder of the signal current $i$ is drawn through the diode 21 and has a value $i_2$. The resistor 22 has a relatively high impedance and makes the circuit comprising the transistor 16 and the resistor 22 a constant current circuit similar to the constant current circuit comprising the transistor 12 and the resistor 13. However, the capacitor 23 has a sufficiently large capacitance to cause its impedance to be negligably small at all frequencies within the band of signals from the source 11. As a result, virtually all of the signal current $i_2$ flows through the capacitor 23 and only the direct current $I_2$ flows through the transistor 16.

The ratio of the output signal current $i_1$ to the current $i_2$ is inversely proportional to the impedance of the circuits through which they flow. The diode 21 is a variable impedance device, the impedance of which is determined by the quiescent current $I_2$ through it. The constant current circuit comprising the control transistor 16 and the resistor 22 sets the value of the quiescent current $I_2$ in accordance with the magnitude $E_c$ of the control voltage source 18 and thus determines the precentage of the current i that will flow through the load impedance 19.

The relationship between the signal current and direct current can be expresses as follows:

$$i_1 = I_1/I \times i \tag{3}$$

The constant signal current is determined by:

$$V_s \approx R_{13} \times i \tag{4}$$

Where $V_s$ is the input signal voltage to the transistor 12 and $R_{13}$ is the resistance of the resistor 13.

Further, the output signal voltage $V_o$ is given by:

$$V_o = R_{19} \times i_1 \tag{5}$$

Where $R_{19}$ is the resistance of the load resistor 19.

From equations (3), (4), and (5), it can be determined that:

$$V_o = (1 - I_2/I)\, R_{19}R_{13}\, V_s \tag{6}$$

That is, the gain of the circuit is controlled, according to equation (6), by changing the direct current bias current $I_2$ by variation of the direct reference voltage $E_c$. The gain characteristic is independent of the direct voltage $E_b$ and varies linearly with respect to the direct current $I_2$ through the diode 21.

Figure 4:
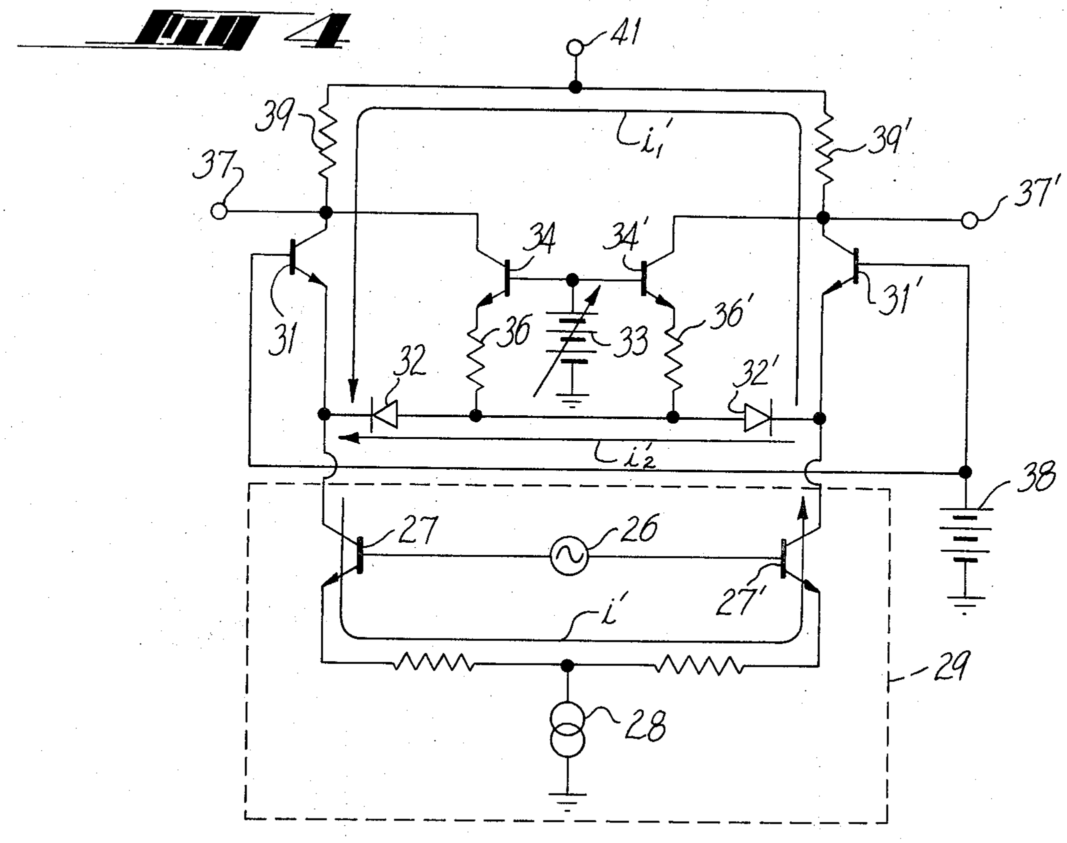
FIG. 4 is a schematic circuit diagram of a balanced amplifier incorporating the gain control circuit of the present invention.

FIG. 4 shows another embodiment of the invention in the form of a balanced circuit. An input signal voltage $V_s'$ from a source 26 is applied between the base electrodes of two differentially connected transistors 27 and 27'. These transistors have their emitter electrodes connected together through resistors 11 and 11'. The common junction of these resistors is connected to ground through a constant direct current source 28, the direct current of which is $I_c$. This section of the circuit is enclosed by a dotted line 29. The entire circuit 29 may be considered a current source that serves not only as a source for signal current but also as a bias current source.

The signal current may be designated as $i'$, and it flows in two loops in this embodiment. One part, $i$, flows through the emitter-collector circuits of two amplifying transistors 31 and 31' connected in series with the emitter-collector circuits of the transistors 27 and 27'. The other part $i_2'$ of the signal current flows through two diodes 32 and 32'. The relationship between these currents is:

$$i' = i_1' + i_2' \tag{7}$$

A direct voltage source 33 having a variable direct voltage $E_c$ is applied to the base electrodes of two transistors 34 and 34'. By changing the value of the voltage $E_c$, direct currents that flow through the transistors 34 and 34' and series-connected resistors 36 and 36' to bias the diodes 32 and 32' are changed at the same time and the same amount. The circuit has output terminals 37 and 37' connected to the collectors of the transistors 31 and 31', respectively. The base electrodes of these transistors are connected directly together to a fixed bias voltage source 38 having a direct voltage $E_b$. Two load resistors 39 and 39' are connected from the collectors of the transistors 31 and 31' to a positive power supply terminal 41.

The circuit in FIG. 4 is virtually a balanced equivalent of the circuit in FIG. 3 and operates in the same way. Variation of the voltage 33 changes the direct current through the diodes 32 and 32' through which a portion $i_2$ of the signal current flows. The remainder $i_1$ of the signal current $i'$ flows through the loads 39 and 39' and changes the output voltages thereacross.

Because of the balanced construction, it is not necessary to provide a capacitor equivalent to the capacitor 23 in FIG. 3. As a result, the circuit in FIG. 4 is more suitable for construction in an integrated circuit than is the circuit in FIG. 3

What is claimed is:

1. A gain control circuit comprising:

A. a constant current source to carry substantially the total direct current and the total signal current of said circuit;

B. a load impedance connected in series with said source to carry said total direct current;

C. a differential direct current circuit connected in series between said source and said load and comprising:

1. a first branch to carry a fraction of said total current, said first branch comprising the collector-emitter circuit of an amplifying transistor, and
2. a second branch to carry the remainder of said total direct current, said second branch comprising the emitter-collector circuit of a control transistor, a circuit element having a high alternating current impedance, and a unidirectionly conductive element;

D. a differential alternating current circuit connected in series with said source, said differential alternating current circuit comprising:

1. a signal amplifying branch comprising said first branch and said load impedance to carry a part of said total signal current, and
2. a signal control branch to carry the remainder of said total signal current and comprising said unidirectionally conductive element and a low alternating current impedance element connected in series therewith; and E. control means to vary the impedance of said unidirectionally conductive element to vary the fraction of said total signal current through said signal control branch.

2. The gain control circuit of claim 1 in which said unidirectionally conductive element is a diode.

3. The gain control circuit of claim 1 in which said low alternating current impedance element comprises a capacitor having a low impedance to said signal current.

4. The gain control circuit of claim 1 in which said circuit element having a high alternating current impedance comprises a resistor.

5. The gain control circuit of claim 4 in which said resistor and said emitter-collector circuit of said control transistor are connected in series between said unidirectionally conductive element and said load impedance.

6. The gain control circuit of claim 5 in which said constant current source, said unidirectionally conductive element and said low alternating current impedance are connected in a closed alternating current loop.

7. A gain control circuit comprising:

A. a constant current source to carry substantially the total direct current and the total signal current of said circuit;

B. first and second load impedances each connected in series with said source to carry one-half said total direct current;

C. first and second differential direct current circuits, each connected in series between said source and a respective one of said load impedances and each comprising:

1. a first branch to carry a fraction of said total direct current, each said first branch comprising the collector-emitter circuit of a respective amplifying transistor, and
2. a second branch to carry the remainder of the direct current in the respective load impedance, each said second branch comprising the collector-emitter circuit of a respective control transistor, a circuit element having a high alternating current impedance, and a unidirectionally conductive non-linear element;

D. first and second differential alternating current circuits connected in series with said source, each of said differential alternating current circuits comprising:

1. a signal amplifying branch comprising the respective first branch and the respective load impedance to carry a part of said total signal current, and
2. a respective signal control branch to carry the remainder of said total signal current and comprising the respective unidirectionally conductive element, said unidirectionally conductive elements being connected in series in opposite polarity; and E. common control means to vary, simultaneously, the impedance of each of said unidirectionally conductive elements to vary the fraction of said total signal current through the respective control branch.

* * * * *